United States Patent
Kakumu et al.

(10) Patent No.: US 11,798,616 B2
(45) Date of Patent: Oct. 24, 2023

(54) MEMORY DEVICE USING SEMICONDUCTOR ELEMENT

(71) Applicant: Unisantis Electronics Singapore Pte. Ltd., Singapore (SG)

(72) Inventors: Masakazu Kakumu, Tokyo (JP); Koji Sakui, Tokyo (JP); Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 0 days.

(21) Appl. No.: 17/901,982

(22) Filed: Sep. 2, 2022

(65) Prior Publication Data

US 2023/0077140 A1    Mar. 9, 2023

(30) Foreign Application Priority Data

Sep. 6, 2021 (WO) .................. PCT/JP2021/032628

(51) Int. Cl.
*G11C 11/00* (2006.01)
*G11C 11/409* (2006.01)
(Continued)

(52) U.S. Cl.
CPC ............ *G11C 11/409* (2013.01); *G11C 11/39* (2013.01); *H01L 24/45* (2013.01); *H10B 12/00* (2023.02)

(58) Field of Classification Search
CPC ........ H10B 12/20; H10B 12/33; H10B 12/00; H10B 12/05; H10B 12/036; H10B 12/30;
(Continued)

(56) References Cited

U.S. PATENT DOCUMENTS

2002/0034855 A1    3/2002  Horiguchi et al.
2010/0142294 A1    6/2010  Carman
(Continued)

FOREIGN PATENT DOCUMENTS

JP    2002-083945 A    3/2002
JP    2009-026448 A    2/2009
JP    2009-212279 A    9/2009

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Density LSI's", IEEE Transaction on Electron Devices, vol. 38, No. 3, pp. 573-578 (1991).

(Continued)

*Primary Examiner* — Thong Q Le
(74) *Attorney, Agent, or Firm* — Crowell & Moring LLP

(57) ABSTRACT

A first semiconductor layer 1 is formed on a substrate, a first impurity layer 3 and a second impurity layer 4 extending in a vertical direction are sequentially disposed on part of the first semiconductor layer 1, their sidewalls and the semiconductor layer 1 are covered by a second gate insulating layer 2, a gate conductor layer 22 and a second insulating layer are disposed in a groove formed there, and a second semiconductor layer 7, n+ layers 6a and 6c positioned at respective ends of the layer 7 and connected to a source line SL and a bit line BL, respectively, a second gate insulating layer 8 formed to cover the second semiconductor layer 7, and a second gate conductor layer 9 connected to a word line WL are disposed on the second impurity layer. Voltage applied to the source line SL, a plate line PL connected to the first gate conductor layer 22, the word line WL, and the bit line BL is controlled to perform data holding operation of holding, near the gate insulating layer, holes generated by an impact ionization phenomenon in a channel region of the (Continued)

second semiconductor layer or by gate-induced drain leakage current, and data erase operation of removing the holes in the channel region 12.

14 Claims, 13 Drawing Sheets

(51) Int. Cl.
    *H01L 23/00*     (2006.01)
    *G11C 11/39*     (2006.01)
    *H10B 12/00*     (2023.01)

(58) Field of Classification Search
CPC ........ H10B 43/40; H10B 51/40; H10B 10/00; H10B 10/12; H10B 12/03; H10B 12/312; H10B 43/27; G11C 11/404; G11C 11/4096; G11C 11/4091; G11C 11/4094; G11C 2211/4016; G11C 11/401; G11C 11/409; G11C 11/4097; G11C 16/02; G11C 16/04; G11C 16/10; G11C 16/14; G11C 16/24; G11C 7/02; G11C 11/39; G11C 16/08; G11C 16/26; G11C 16/32; G11C 16/3418; G11C 11/406; G11C 11/4072; G11C 11/4076; G11C 11/4085; G11C 11/4087; G11C 16/0408; G11C 16/0466; G11C 16/16; G11C 16/28; G11C 2211/401; G11C 2211/4068; G11C 5/025; G11C 5/063; G11C 7/04; G11C 7/1006; G11C 8/14; H01L 29/7841; H01L 27/10; H01L 29/7827; H01L 29/66477; H01L 24/45; H01L 28/90; H01L 29/66666; H01L 29/788; H01L 29/792; H01L 21/2018; H01L 21/2253; H01L 21/2255; H01L 21/2257; H01L 21/28088; H01L 21/28114; H01L 21/28123; H01L 21/28132; H01L 21/28518; H01L 21/28568; H01L 21/3086; H01L 21/31111; H01L 21/31116; H01L 21/76; H01L 21/764; H01L 21/76805; H01L 21/76829; H01L 21/76831; H01L 21/76834; H01L 21/7684; H01L 21/76877; H01L 21/76897; H01L 21/76898; H01L 21/8221; H01L 21/823418

See application file for complete search history.

(56) References Cited

U.S. PATENT DOCUMENTS

2011/0221001 A1     9/2011     Song et al.
2018/0083004 A1*    3/2018     Sato ................. H01L 27/14612

OTHER PUBLICATIONS

H. Chung, H. Kim, H. Kim, K. Kim, S. Kim, K. Song, J. Kim, Y.C. Oh, Y. Hwang, H. Hong, G. Jin, and C. Chung: "Novel $4F^2$ DRAM Cell with Vertical Pillar Transistor(VPT)," 2011 Proceeding of the European Solid-State Device Research Conference, (2011).

H. S. Philip Wong, S. Raoux, S. Kim, Jiale Liang, J. P. Reifenberg, B. Rajendran, M. Asheghi and K. E. Goodson: "Phase Change Memory," Proceeding of IEEE, vol. 98, No. 12, December, pp. 2201-2227 (2010).

K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosum, K. Lim, C. Park, J. Oh, P. Kirsch, and K. C. Saraswat : "Novel Capacitorless Single-Transistor Charge-Trap DRAM (1T CT DRAM) Utilizing Electrons," IEEE Electron Device Letter, vol. 31, No. 5, pp. 405-407 (2010).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697,Apr. 2006.

Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, pp. 1471-1479 (2020).

* cited by examiner

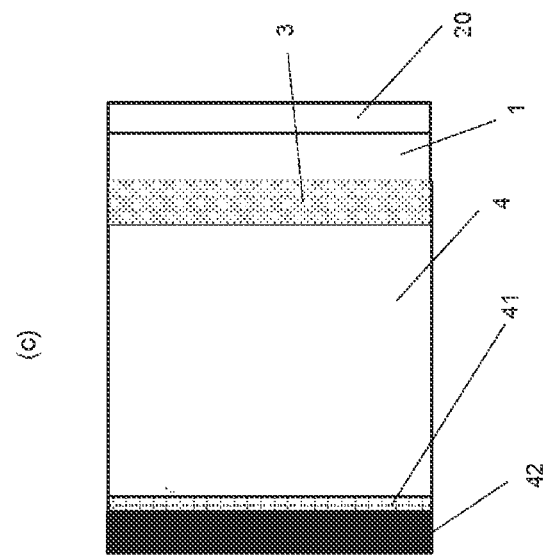
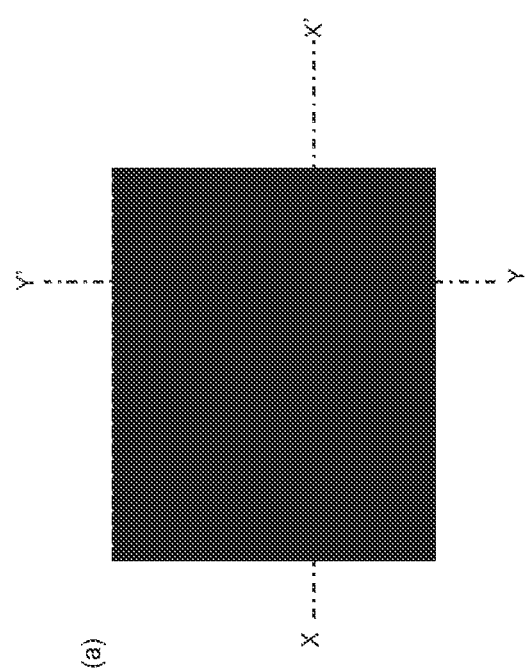
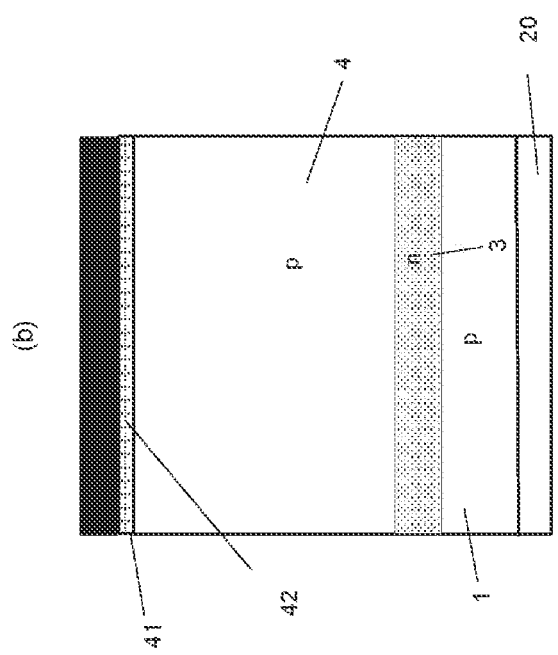
FIG. 4A

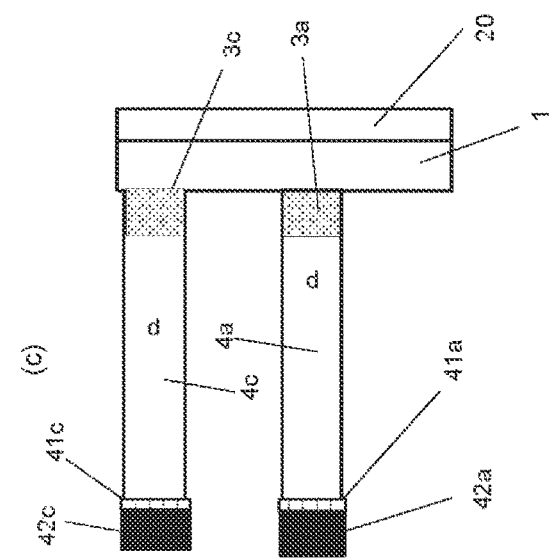
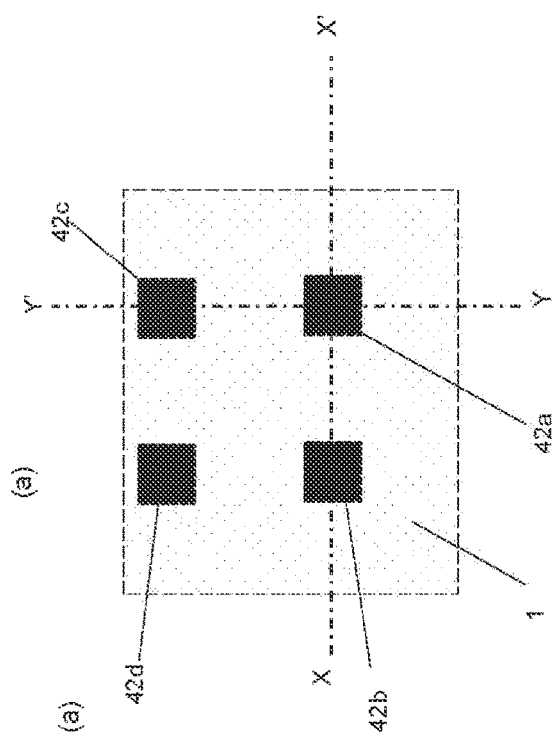
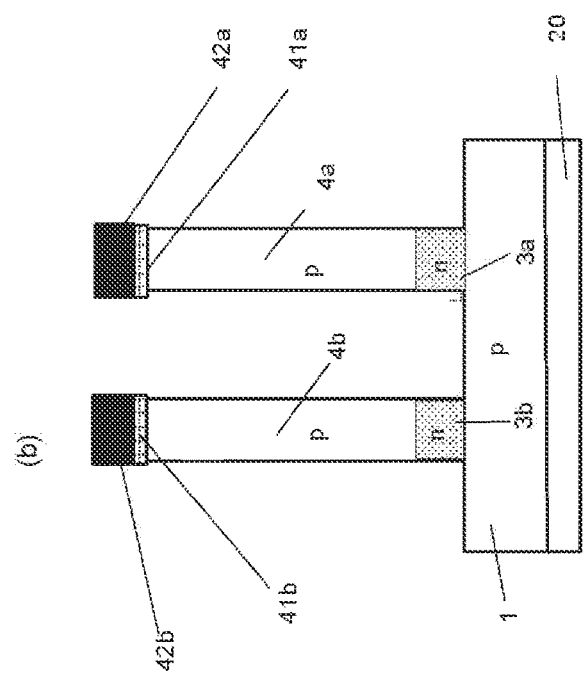
FIG. 4B

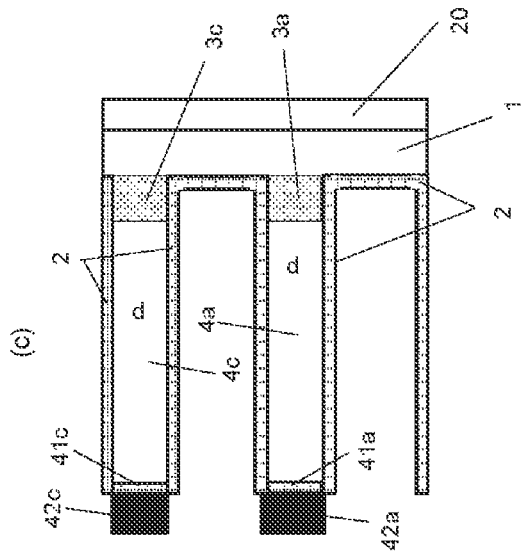
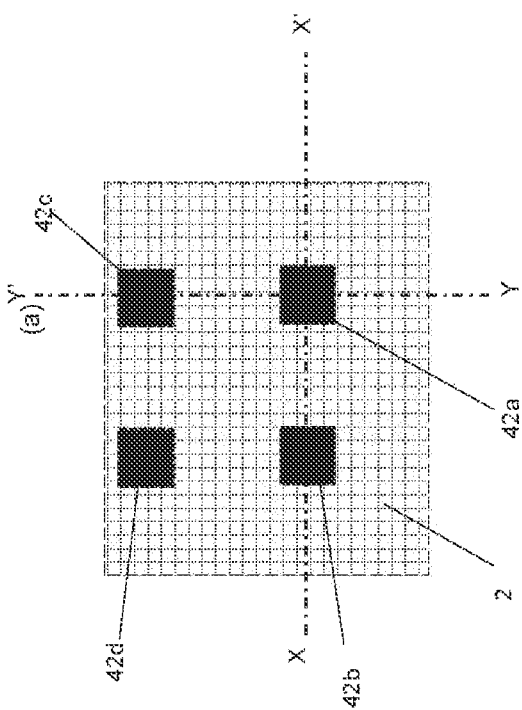
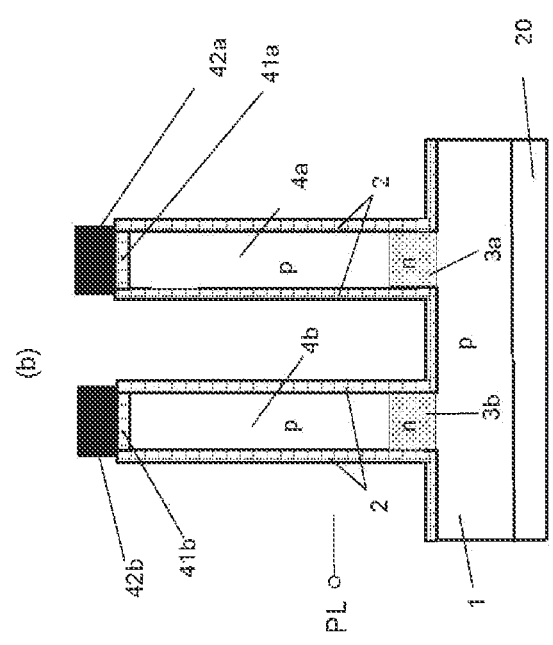
FIG. 4C

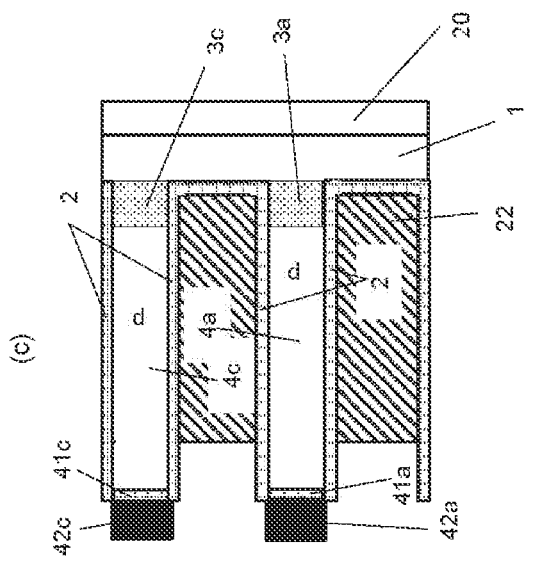
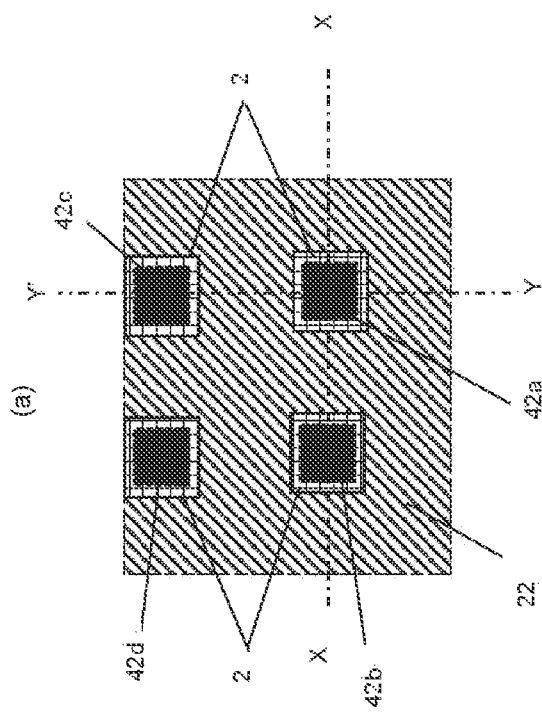
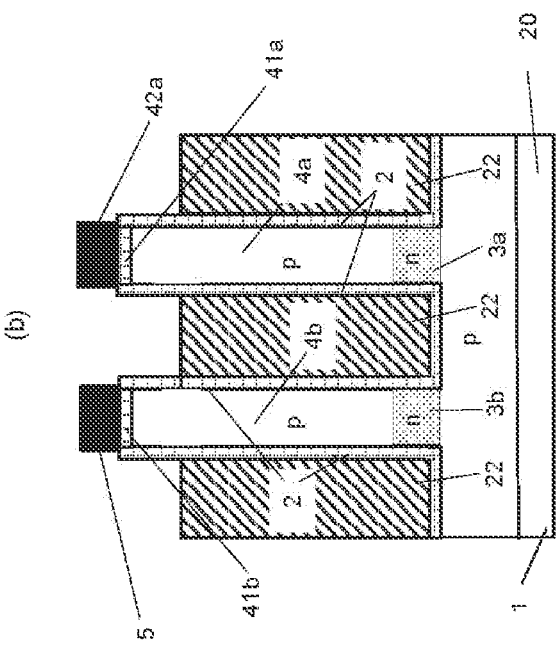
FIG. 4D

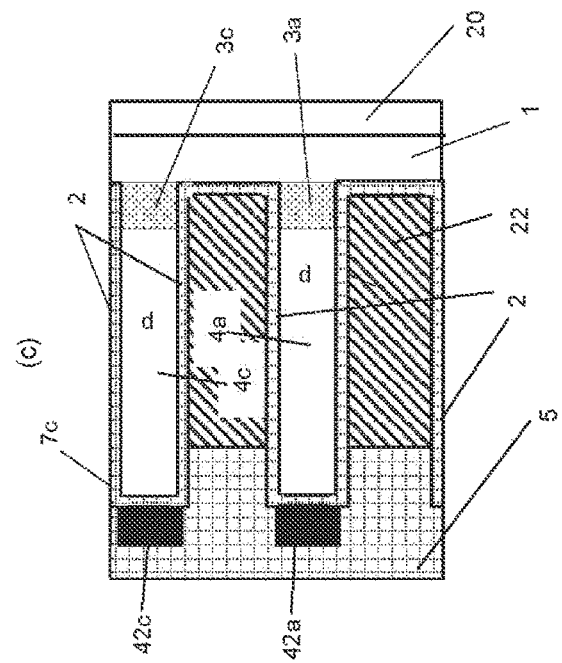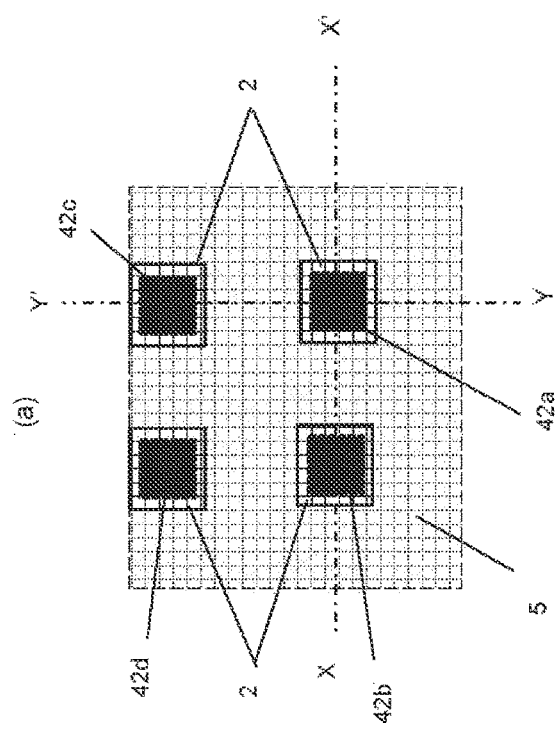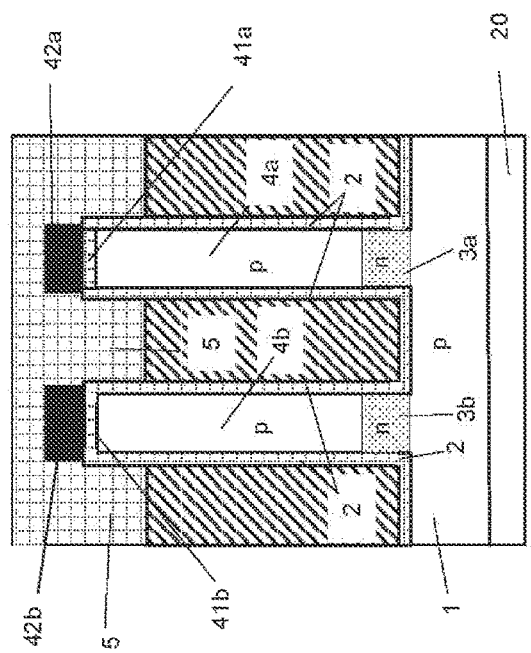
FIG. 4E

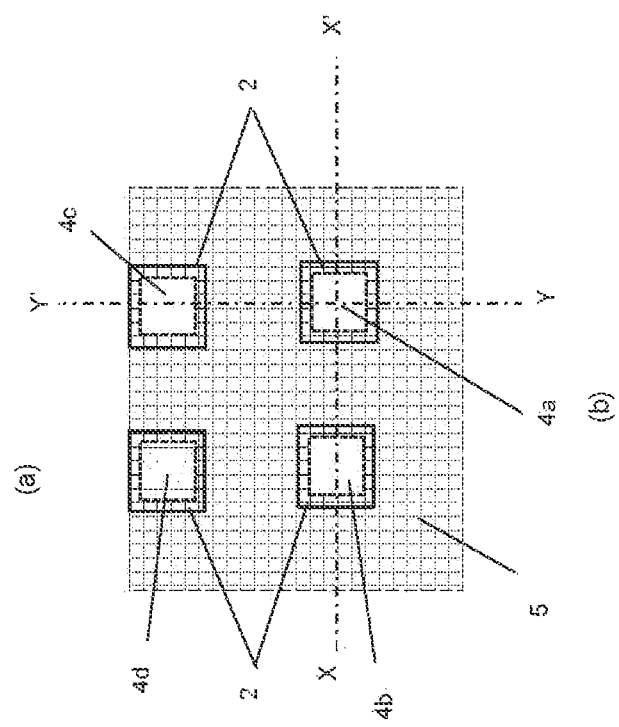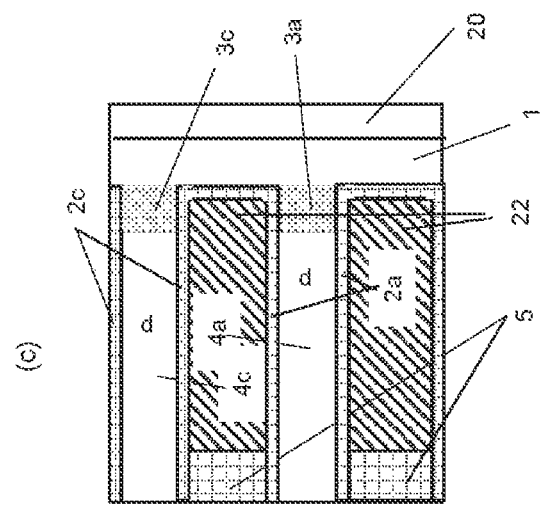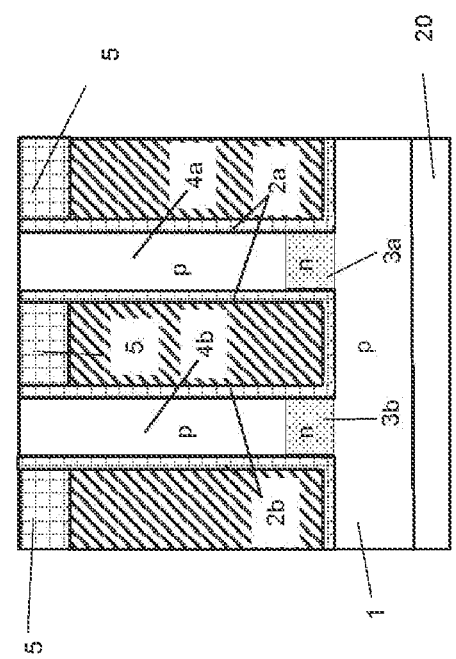
FIG. 4F

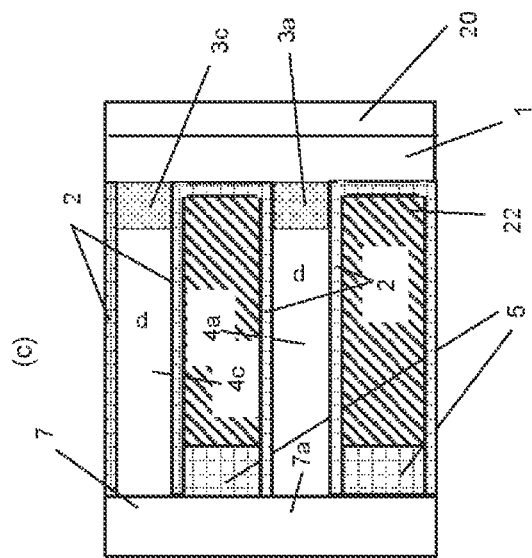
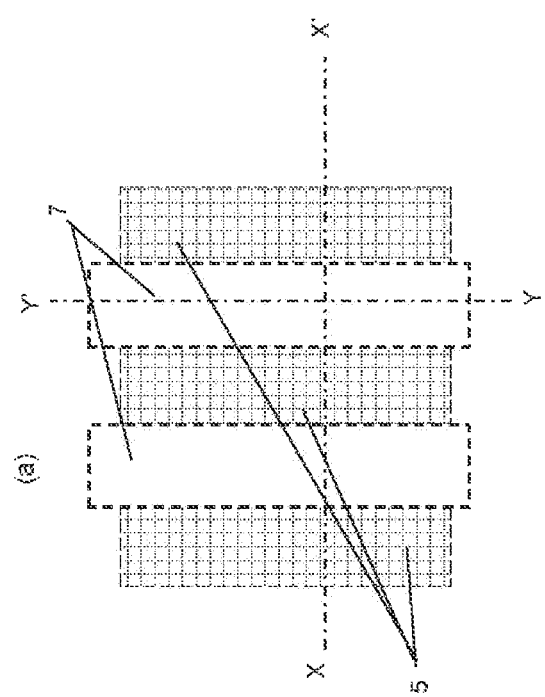
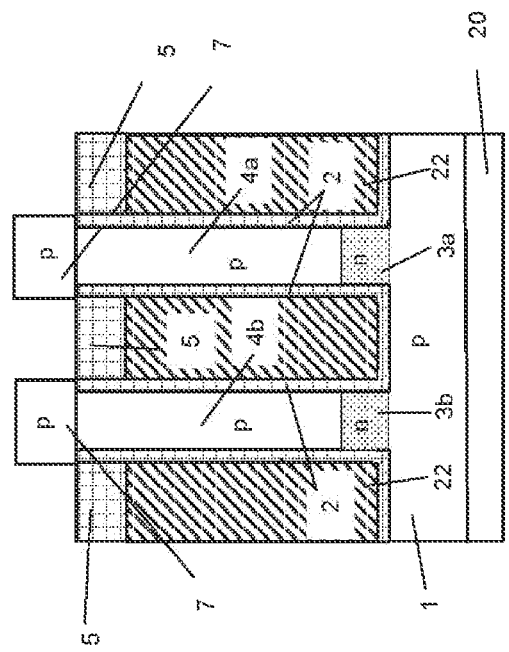
FIG. 4G

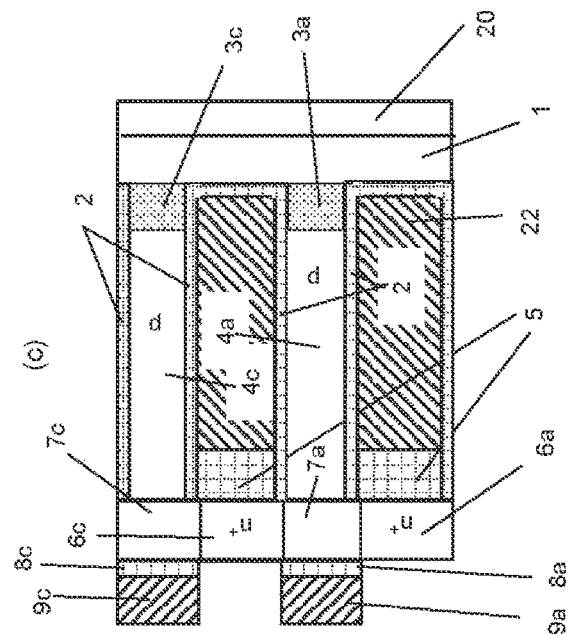
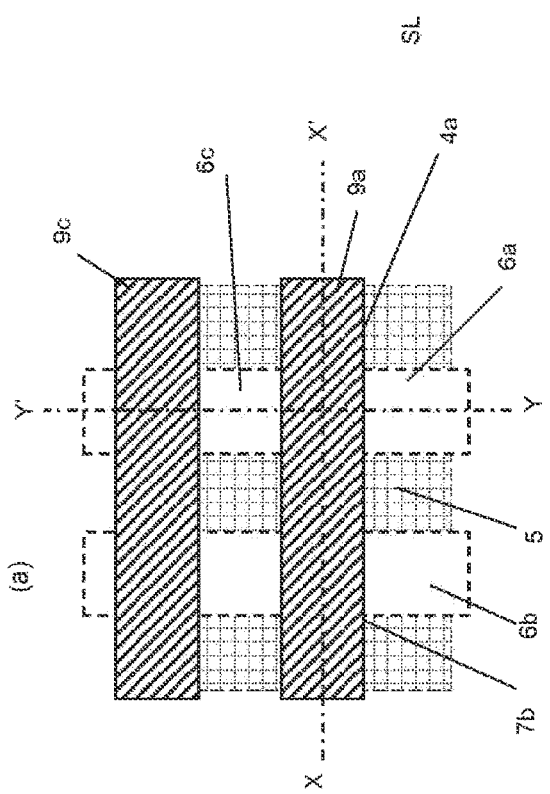
FIG. 4H

MEMORY DEVICE USING SEMICONDUCTOR ELEMENT

CROSS-REFERENCE TO RELATED APPLICATIONS

This application claims priority to PCT/JP2021/032628 filed Sep. 6, 2021, the enter content of which is incorporated herein by reference.

TECHNICAL FIELD

The present invention relates to a memory device using a semiconductor element.

BACKGROUND ART

High integration, high performance, low electric power consumption, and high functionality of a memory element have been requested in recent development of large scale integration (LSI) technologies.

In a normal planar MOS transistor, a channel extends in a horizontal direction along the upper surface of a semiconductor substrate. However, a channel of an SGT extends in a direction orthogonal to the upper surface of a semiconductor substrate (refer to Non Patent Literature 1, for example). Thus, densification of a semiconductor device is possible with the SGT unlike with the planar MOS transistor. The SGT can be used as a selection transistor to achieve high integration of a dynamic random access memory (DRAM; refer to Non Patent Literature 2, for example) connected to a capacitor, a phase change memory (PCM; refer to Non Patent Literature 3, for example) connected to a resistance change element, a resistive random access memory (RRAM; refer to Non Patent Literature 4, for example), a magneto-resistive random access memory (MRAM; refer to Non Patent Literature 5, for example) that changes resistance by changing the orientation of magnetic spin by current, and the like. In addition, there are, for example, a DRAM memory cell (refer to Non Patent Literature 6) including no capacitor and constituted by one MOS transistor, and a DRAM memory cell (refer to Non Patent Literature 8) including a groove portion in which carriers are accumulated and two gate electrodes. However, a problem with a DRAM including no capacitor is that a sufficient voltage margin cannot be obtained due to high dependency on coupling of a gate electrode to a word line of a floating body. Furthermore, complete depletion of a substrate provides a severe adverse effect. The present application relates to a memory device using a semiconductor element and only including an MOS transistor without a resistance change element or a capacitor.

CITATION LIST

Non Patent Literature

Non Patent Literature 1

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)

Non Patent Literature 2

H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)

Non Patent Literature 3

H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No 12, December, pp. 2201-2227 (2010)

Non Patent Literature 4

T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V", IEDM (2007)

Non Patent Literature 5

W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)

Non Patent Literature 6

M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)

Non Patent Literature 7

E. Yoshida, T. Tanaka, "A Capacitorless 1T-DRAM Technology Using Gate-Induced Drain-Leakage (GIDL) Current for Low-Power and High-Speed Embedded Memory", IEEE Trans, on Electron Devices vol. 53, pp. 692-697 (2006)

Non Patent Literature 8

Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, pp. 1471-1479 (2020)

SUMMARY OF INVENTION

Technical Problem

In a single-transistor DRAM (gain cell) including no capacitor in a memory device, capacitive coupling between a word line and a body including a floating element is large, and amplification of the potential of the word line at data reading and writing is directly transferred as noise to the body of a semiconductor substrate, which has been a problem. As a result, problems such as false reading and false rewriting of stored data occur, and practical use of a single-transistor DRAM (gain cell) including no capacitor has been difficult. Thus, it is needed to solve the above-described problem and densify a DRAM memory cell.

Solution to Problem

To solve the above-described problem, a memory device using a semiconductor element according to the present invention includes:
a substrate;
a first semiconductor layer disposed on the substrate;
a first impurity layer disposed on a surface of part of the first semiconductor layer, at least part of the first impurity layer being column-shaped;
a second impurity layer contacting the column-shaped part of the first impurity layer and extending in a vertical direction;
a first insulating layer covering part of the first semiconductor layer and part of the first impurity layer;
a first gate insulating layer contacting the first insulating layer and surrounding the first impurity layer and the second impurity layer;
a first gate conductor layer contacting the first insulating layer and the first gate insulating layer;
a second insulating layer formed in contact with the first gate conductor layer and the first gate insulating layer;
a second semiconductor layer contacting the second impurity layer;
a second gate insulating layer surrounding part or entire of an upper part of the second semiconductor layer;
a second gate conductor layer covering part or entire of an upper part of the second gate insulating layer;
a third impurity layer and a fourth impurity layer contacting a side surface of the second semiconductor layer outside one end of the second gate conductor layer in a horizontal direction in which the second semiconductor layer extends;
a first wire conductor layer connected to the third impurity layer;
a second wire conductor layer connected to the fourth impurity layer;
a third wire conductor layer connected to the second gate conductor layer; and
a fourth wire conductor layer connected to the first gate conductor layer, in which
memory write operation is performed by controlling voltage applied to the first wire conductor layer, the second wire conductor layer, the third wire conductor layer, and the fourth wire conductor layer to perform operation of generating electrons and holes in the second semiconductor layer and the second impurity layer by an impact ionization phenomenon with current flowing between the third impurity layer and the fourth impurity layer or by gate-induced drain leakage current, operation of removing the electrons or holes that are minority carriers in the second semiconductor layer and the second impurity layer among the generated electrons and holes, and operation of leaving, in the second semiconductor layer and the second impurity layer, some or all of the electrons or holes that are majority carriers in the first semiconductor layer and the second impurity layer, and
memory erase operation is performed by controlling voltage applied to the first wire conductor layer, the second wire conductor layer, the third wire conductor layer, and the fourth wire conductor layer to remove the left electrons or holes that are majority carriers in the second semiconductor layer from at least one of the first impurity layer, the third impurity layer, and the fourth impurity layer (first invention).

In the above-described first invention, the first wire conductor layer connected to the third impurity layer is a source line, the second wire conductor layer connected to the fourth impurity layer is a bit line, the third wire conductor layer connected to the second gate conductor layer is a word line, the fourth wire conductor layer connected to the first gate conductor layer is a plate line, and memory writing and erasure are performed by providing voltage to the source line, the bit line, the plate line, and the word line, respectively (second invention).

In the above-described first invention, majority carriers in the first impurity layer are different from majority carriers in the first semiconductor layer (third invention).

In the above-described first invention, majority carriers in the second impurity layer are same as majority carriers in the first semiconductor layer (fourth invention).

In the above-described first invention, majority carriers in the third impurity layer and the fourth impurity layer are same as majority carriers in the first impurity layer (fifth invention).

In the above-described first invention, concentration is lower in the first impurity layer than in the third impurity layer and the fourth impurity layer (sixth invention).

In the above-described first invention, an upper part of the first impurity layer is positioned shallower than a bottom part of the first gate conductor layer (seventh invention).

In the above-described first invention, the first semiconductor layer, the first impurity layer, the second impurity layer, the second semiconductor layer, and the third impurity layer form a thyristor structure (eighth invention).

In the above-described first invention, the first semiconductor layer, the first impurity layer, the second impurity layer, the second semiconductor layer, and the fourth impurity layer form a thyristor structure (ninth invention).

In the above-described second invention, a source-line contact hole for connecting the source line and the third impurity layer, and the first wire conductor layer are shared between adjacent cells (tenth invention).

In the above-described second invention, a bit-line contact hole for connecting the bit line and the fourth impurity layer, and the second wire conductor layer are shared between adjacent cells (eleventh invention).

In the above-described first or second invention, a bottom part of the first impurity layer is positioned deeper than a bottom part of the first insulating layer, and the first impurity layer is shared among a plurality of cells (twelfth invention).

In the above-described twelfth invention, a fifth wire conductor layer connected to the first impurity layer is further included, and the wire conductor layer is a control line to which desired voltage can be applied (twelfth invention).

In the above-described first invention, the first impurity layers of a plurality of memory cells are connected to each other by using a semiconductor, a metal layer, or an alloy layer (thirteenth invention).

BRIEF DESCRIPTION OF DRAWINGS

FIGS. 4AA, 4AB and 4AC are diagrams for description of a method of manufacturing the memory device according to the first embodiment.

FIGS. 4BA, 4BB and 4BC are diagrams for description of the method of manufacturing the memory device according to the first embodiment.

FIGS. 4CA, 4CB and 4CC are diagrams for description of the method of manufacturing the memory device according to the first embodiment.

FIGS. 4DA, 4DB and 4DC are diagrams for description of the method of manufacturing the memory device according to the first embodiment.

FIGS. 4EA to 4EC are diagrams for description of the method of manufacturing the memory device according to the first embodiment.

FIGS. 4FA, 4FB and 4FC are diagrams for description of the method of manufacturing the memory device according to the first embodiment.

FIGS. 4GA, 4GB and 4GC are diagrams for description of the method of manufacturing the memory device according to the first embodiment.

FIGS. 4HA, 4HB and 4HC are diagrams for description of the method of manufacturing the memory device according to the first embodiment.

FIGS. 4IA, 4IB and 4IC are diagrams for description of the method of manufacturing the memory device according to the first embodiment.

MODE FOR CARRYING OUT THE INVENTION

The structure of a memory device using a semiconductor element according to the present invention, a drive method thereof, and the behavior of accumulation carriers therein will be described below with reference to the accompanying drawings.

First Embodiment

The structure and operation mechanism of a memory cell using a semiconductor element according to a first embodiment of the present invention will be described below with reference to FIGS. 1 to 3A-3C. The cell structure of the memory using the semiconductor element according to the present embodiment will be described below with reference to FIG. 1. The writing mechanism and carrier behavior of the memory using the semiconductor element will be described below with reference to FIGS. 2A to 2C, and the data erase mechanism thereof will be described below with reference to FIGS. 3A to 3C.

Figure 1:
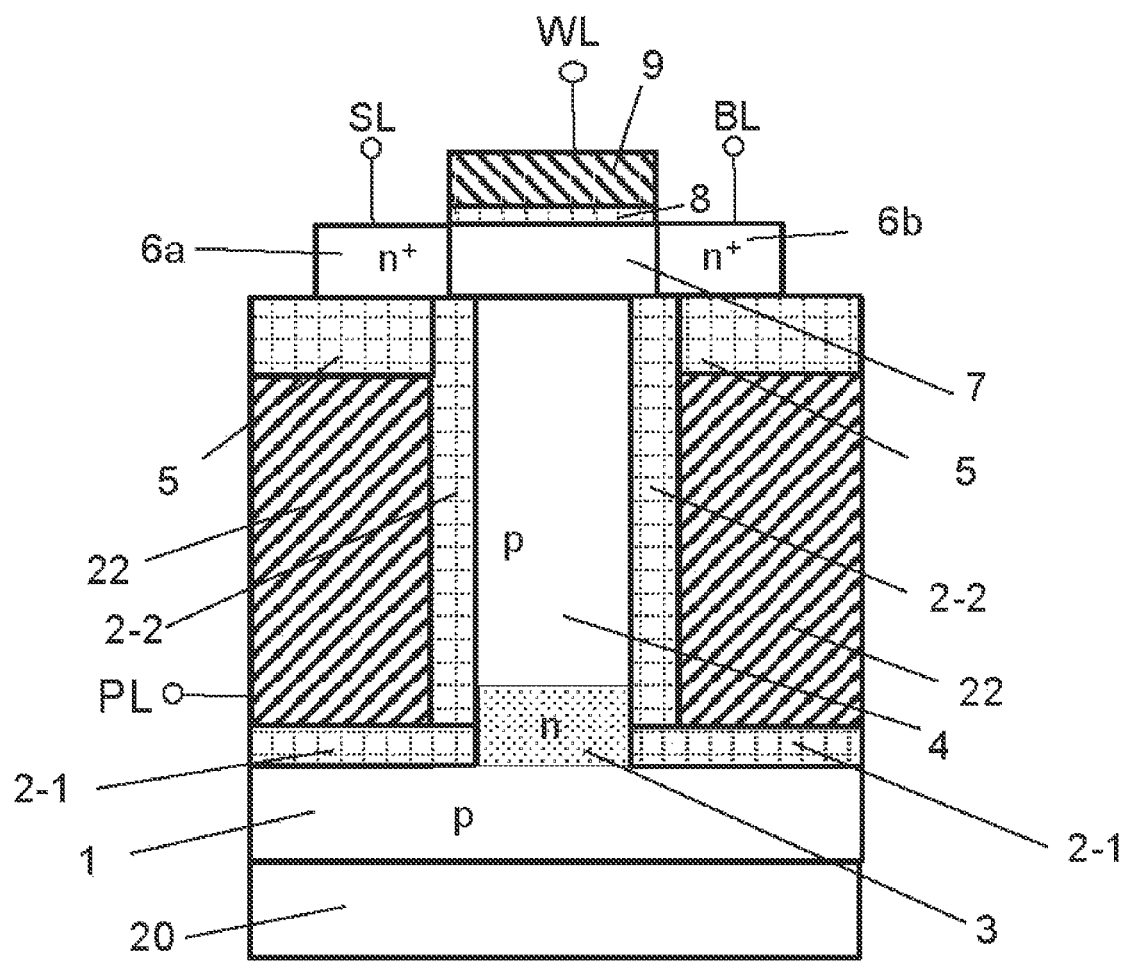
FIG. 1 illustrates a sectional structure of a memory device using a semiconductor element according to a first embodiment.

FIG. 1 illustrates a sectional structure of the memory using the semiconductor element according to the first embodiment of the present invention. A p layer 1 (example of a "first semiconductor layer" in the claims) made of silicon, containing acceptor impurities, and having a p-type conduction type is disposed on a substrate 20 (example of a "substrate" in the claims). A semiconductor including a column-shaped n layer 3 (example of a "first impurity layer" in the claims) containing donor impurities and standing in the vertical direction on the surface of the p layer 1 is disposed, and a column-shaped p layer 4 (example of a "second impurity layer" in the claims) containing acceptor impurities is disposed on the n layer 3. A first insulating layer 2-1 (example of a "first insulating layer" in the claims) covers part of the p layer 1 and the n layer 3, and a first gate insulating layer 2-2 (example of a "first gate insulating layer" in the claims) covers part of the p layer 4 are disposed. A first gate conductor layer 22 (example of "first gate conductor layer" in the claims) contacts the first insulating layer 2-1 and the first gate insulating layer 2-2. A second insulating layer 5 (example of a "second insulating layer" in the claims) contacts the gate insulating layer 2-2 and the gate conductor layer 22. A p layer 7 (example of a "second semiconductor layer" in the claims) containing acceptor impurities contacts the p layer 4.

An $n^+$ layer 6a (example of a "third impurity layer" in the claims) containing donor impurities at high concentration is disposed on a side of the p layer 7 (hereinafter, a semiconductor region containing donor impurities at high concentration is referred to as an "$n^+$ layer"). An $n^+$ layer 6b (example of a "fourth impurity layer" in the claims) is disposed on a side opposite the $n^+$ layer 6a.

A second gate insulating layer 8 (example of a "second gate insulating layer" in the claims) is disposed on the upper surface of the p layer 7. The gate insulating layer 8 contacts or is positioned close to each of the n layers 6a and 6b. A second gate conductor layer 9 (example of a "second gate conductor layer" in the claims) contacts the gate insulating layer 8 on a side opposite the semiconductor layer 7.

Accordingly, a memory device using a semiconductor element including the substrate 20, the p layer 1, the insulating layer 2-1, the gate insulating layer 2-2, the gate conductor layer 22, the insulating layer 5, the n layer 3, the p layer 4, the $n^+$ layer 6a, the $n^+$ layer 6b, the semiconductor layer 7, the gate insulating layer 8, and the gate conductor layer 9 is formed. Then, the n-layer 6a is connected to a source line SL (example of a "source line" in the claims) that is a first wiring conductive layer, the $n^+$ layer 6b is connected to a bit line BL (example of a "bit line" in the claims) that is a second wiring conductive layer, the gate conductor layer 9 is connected to a word line WL (example of a "word line" in the claims) that is a third wiring conductive layer, and the gate conductor layer 22 is connected to a plate line PL (example of a "plate line" in the claims) that is a fourth wiring conductive layer. Memory operation is performed by manipulating the potential of the source line, the potential of the bit line, the potential of the plate line, and the potential of the word line. Hereinafter, the memory device is also referred to as a dynamic flash memory.

In the memory device, a plurality of above-described dynamic flash memory cells are one- or two-dimensionally disposed on the substrate 20.

The p layer 1 is a p-type semiconductor in FIG. 1, but a profile may be provided for impurity concentration. In addition, profiles may be provided for impurity concentrations of the n layer 3, the p layer 4, and the p layer 7. Impurity concentrations and profiles may be independently set for the p layer 4 and the p layer 7.

When the $n^+$ layer 6a and the $n^+$ layer 6b are formed as $p^+$ layers (hereinafter, a semiconductor region containing acceptor impurities at high concentration is referred to as a "$p^+$ layer") in which majority carriers are holes, operation of a dynamic flash memory is performed with electrons as writing carriers by employing n-type semiconductors as the p layer 1, the p layer 4, and the p layer 7 and employing a p-type semiconductor as the n layer 3.

The first semiconductor layer 1 is a p-type semiconductor in FIG. 1, but operation of a dynamic flash memory is performed with a memory cell of the present invention by using an n-type semiconductor substrate as the substrate 20 and forming a p well as the first semiconductor layer 1.

The insulating layer 2-1 and the gate insulating layer 2-2 are distinguished in FIG. 1 but may be formed an integration. In the following description, the insulating layer 2-1 and the gate insulating layer 2-2 are also collectively referred to as a gate insulating layer 2.

The second semiconductor layer 7 is a p-type semiconductor in FIG. 1, but a p-type, n-type, or i-type semiconductor may be used as the second semiconductor layer 7, depending on the majority carrier concentration of the p layer 4, the thickness of the second semiconductor layer 7, the material and thickness of the gate insulating layer 8, and the material of the gate conductor layer 9.

A bottom part of the p layer 7 aligns with the upper surface of the insulating layer 5 in the illustration of FIG. 1, but the interface between the p layer 4 and the p layer 7 does not necessarily need to align with the upper surface of the insulating layer 5 as long as the p layer 4 contacts the p layer 7 and a bottom part of the p layer 4 is deeper than a bottom part of the insulating layer 5.

The substrate 20 may be an insulator, a semiconductor, or a conductor and may be made of an optional material that can support the p layer 1.

The gate conductor layer 22 may be a semiconductor layer doped at high concentration or a conductor layer as long as the potential of part of the memory cell can be changed through the insulating layer 2-1 or the gate insulating layer 2-2.

The first to fourth wiring conductive layers may be formed in a multi-layer structure as long as the layers do not contact each other.

A bottom part of the n layer 3 aligns with a bottom part of the gate insulating layer 2-1 in the illustration of FIG. 1, but the n layer 3 does not necessarily need to align as long as the n layer 3 contacts both the p layer 1 and the gate insulating layer 2.

The n layer 3 of the memory cell is connected to the p layer 1 in FIG. 1, but part thereof may be connected to the n layer 3 in place of the p layer 1 by using a metal layer.

Although FIG. 1 illustrates a normal MOS transistor structure formed of the n layers 6a and 6b, the gate insulating layer 8, the p layer 7, and the gate conductor layer 9, memory operation may be performed with a FINFET in which the interface between the p layer 7 and the gate insulating layer 8 is positioned higher than the n layers 6a and 6b.

Figure 2:
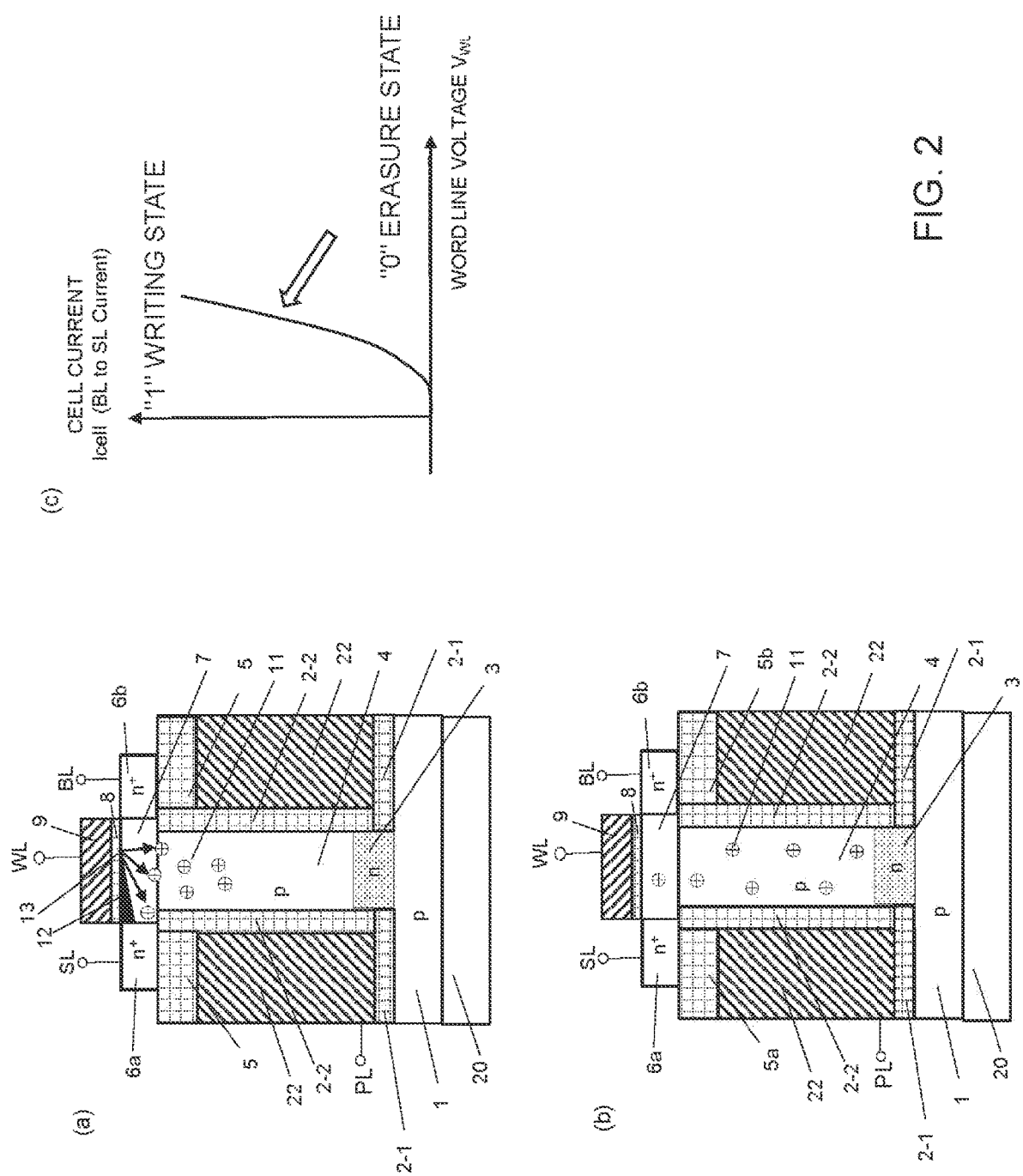
FIGS. 2A, 2B and 2C are diagrams for description of write operation, carrier accumulation right after the operation, and cell current in the memory device using the semiconductor element according to the first embodiment.

Carrier behavior, accumulation, and cell current in the dynamic flash memory according to the first embodiment of the present invention at write operation will be described below with reference to FIGS. 2A to 2C. Majority carriers in the n$^+$ layer 6a and the n$^+$ layer 6b are electrons, and for example, p$^+$ poly (hereinafter, poly Si containing acceptor impurities at high concentration is referred to as "p$^+$ poly") is used as the gate conductor layer 22 connected to PL. In addition, n$^+$ poly (hereinafter, poly Si containing donor impurities at high concentration is referred to as "n$^+$ poly") is used as the gate conductor layer 9 connected to WL, and a p-type semiconductor is used as the second semiconductor layer 7 in description below. As illustrated in FIG. 2 A, a MOSFET in the memory cell actuates with constituent components of the n$^+$ layer 6a serving as a source, the n$^+$ layer 6b serving as a drain, the gate insulating layer 8, the gate conductor layer 9 serving as a gate, and the p layer 7 serving as a substrate. For example, 0 V is applied to the p layer 1, for example, 0 V is input to the n$^+$ layer 6a connected to the source line SL, for example, 3 V is input to the n$^+$ layer 6b connected to the bit line BL, for example, 0 V is input to the gate conductor layer 22 connected to the plate line PL, and for example, 1.5 V is input to the gate conductor layer 9 connected to the word line WL. A partial inversion layer 12 is formed directly below the gate insulating layer 8 below the gate conductor layer 9, and a pinch-off point 13 exists. Accordingly, the MOSFET including the gate conductor layer 9 operates in a saturation region.

As a result, in the MOSFET including the gate conductor layer 9, electric field is maximum in a boundary region between the pinch-off point 13 and the n$^+$ layer 6b, and an impact ionization phenomenon occurs in the region. Due to the impact ionization phenomenon, electrons accelerated from the n$^+$ layer 6a connected to the source line SL toward the n$^+$ layer 6b connected to the bit line BL collides with an Si lattice, and electron-hole pairs are generated by kinetic energy of the electrons. Some of the generated electrons flows to the gate conductor layer 9, but most of them flow to the n$^+$ layer 6b connected to the bit line BL.

Note that holes may be generated by causing flow of gate induction drain leakage (GIDL) current instead of causing the above-described impact ionization phenomenon (refer to Non Patent Literature 7, for example).

FIG. 2B illustrates holes 11 in the p layer 4 and the p layer 7 when all biases become 0 V right after writing. The generated holes 11 are majority carriers in the p layer 4 and the p layer 7, move toward the p layer 4 due to the gradient of the concentration thereof, are uniformly accumulated in the p layer 4 and the p layer 7 in a short time, and charge the p layer 7 as the substrate of the MOSFET including the gate conductor layer 9 in positive bias in effect in a non-equilibrium state. Holes in a depleted layer move to the SL side or the n layer 3 side by electric field and recombine with electrons. As a result, the threshold voltage of the MOSFET including the gate conductor layer 9 decreases due to a positive substrate bias effect by holes temporarily accumulated in the p layer 4 and the p layer 7. Accordingly, as illustrated in FIG. 2C, the threshold voltage of the MOSFET including the gate conductor layer 9 connected to the word line WL decreases. This write state is allocated to logic storage data "1".

Note that conditions on voltage applied to the bit line BL, the source line SL, the word line WL, and the plate line PL described above are examples for performing write operation and may be other voltage conditions with which write operation can be performed.

Although n$^+$ poly is used as the gate conductor layer 9 in FIGS. 2A to 2C, a semiconductor doped at high concentration such as p$^+$ poly, a metal layer such as W, or a layered metal layer such as W/TiN may be used.

Although p$^+$ poly is used as the gate conductor layer 22 in FIGS. 2A to 2C, n poly, a metal layer, metal nitride, a metal laminated structure, or a conductor layer such as silicide may be used. These materials may be selected depending on voltage applied to a PL electrode at data writing, the film thickness of the insulating layer 2, and the impurity concentration of the p layer 4.

According to a structure of the present embodiment, since the p layer 7 of the MOSFET including the gate conductor layer 9 connected to the word line WL is electrically connected to the p layer 4, the capacity of accumulation of generated holes can be freely changed by adjusting the volume of the p layer 4. Thus, for example, the depth of the p layer 4 may be increased to achieve a longer holding time. Accordingly, it is requested that the bottom part of the p layer 4 is positioned deeper than the bottom part of the p layer 7. Moreover, the contact area of the n layer 3, the n$^+$ layer 6*a*, and the n⁺ layer 6*b*, which contribute to recombination with electrons, can be decreased as compared to the volume of a part at which hole carriers are accumulated, such as the p layer 4 and the p layer 7 in this example, and thus recombination with electrons can be prevented to increase the holding time of accumulated holes. Furthermore, the work function of the gate conductor layer 22 can be freely selected. In addition, since p⁺ poly is used as the gate conductor layer 22 in the example illustrated in FIG. 1, holes are accumulated near the interface of the p layer 4 as the second impurity layer contacting the first gate insulating layer 2-2, and thus the holes can be stably accumulated. Accordingly, an entire substrate bias effect occurs to the substrate as a memory element, the storage holding time increases, and the voltage margin of "1" writing expands.

Figure 3:
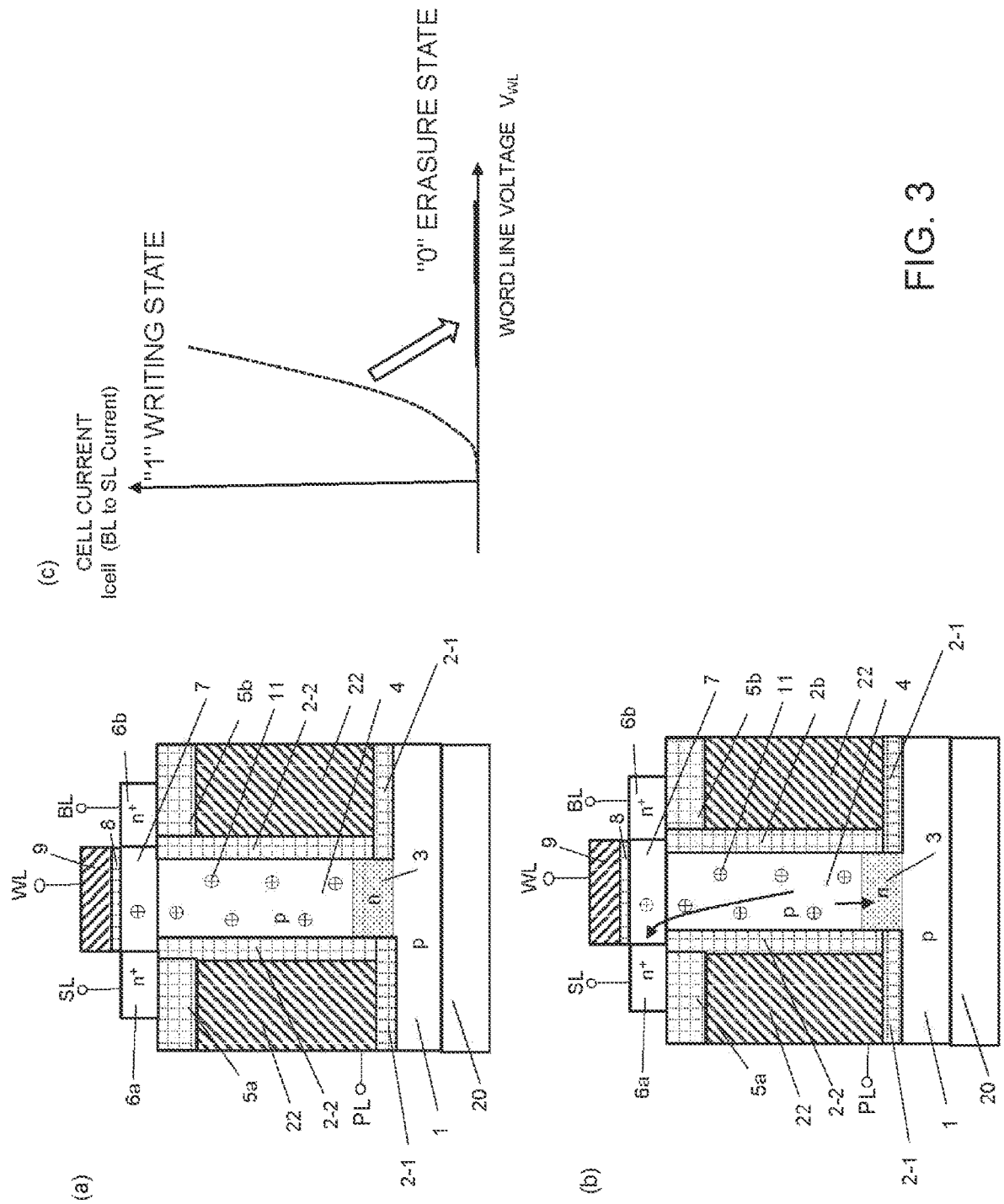
FIGS. 3A, 3B and 3C are diagrams for description of accumulation of hole carriers right after write operation, erase operation, and cell current in the memory device using the semiconductor element according to the first embodiment.
Figure 41:
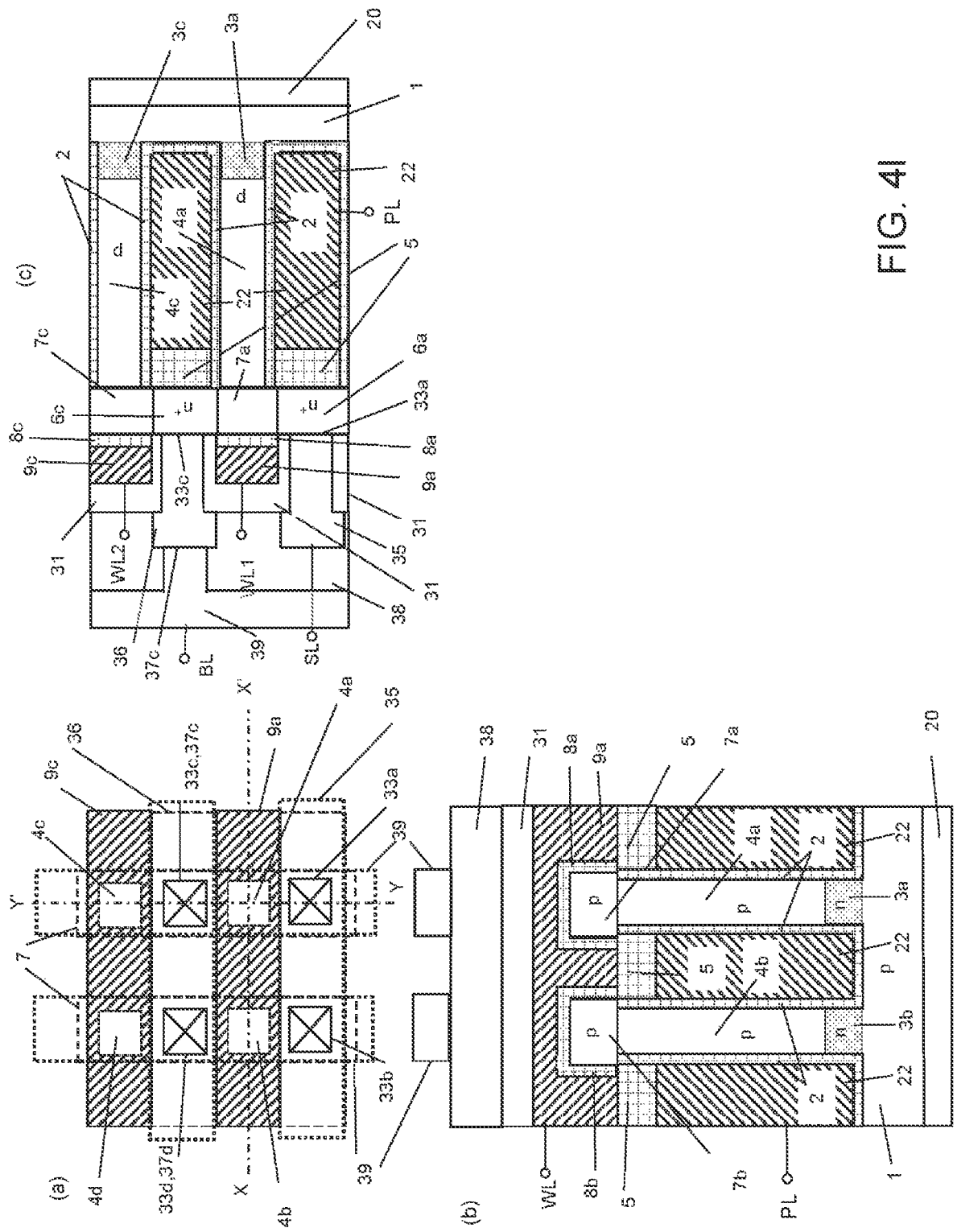

An erase operation mechanism will be described below with reference to FIGS. 3A to 3C. FIG. 3A illustrates a state right after the holes 11 generated by impact ionization in the previous cycle are stored in the p layer 4 and the p layer 7 and all biases become 0 V before erase operation. As illustrated in FIG. 3B, at erase operation, the voltage of the source line SL is set to negative voltage VERA. The voltage VERA is, for example, −3 V. As a result, the PN junction of the n⁺ layer 6*a* as the source connected to the source line SL and the p layer 7 is forward biased irrespective of the value of the initial potential of the p layer 7. As a result, the holes 11 generated by impact ionization in the previous cycle and stored in the p layer 4 and the p layer 7 move to the n⁺ layer 6*a* connected to the source line. A small number of holes flow from the p layer 4 to the n layer 3 and recombine with electrons. As a result, the hole concentrations of the p layer 4 and the p layer 7 decrease with time, and the threshold voltage of the MOSFET becomes higher than at "1" writing and returns to an initial state. Accordingly, as illustrated in FIG. 3 C, the MOSFET including the gate conductor layer 9 connected to the word line WL returns to the original threshold value. The erase state of the dynamic flash memory is logic storage data "0".

According to the structure of the present embodiment, a thyristor structure is formed by the p layer 1, the n layer 3, the p layer 4, the p layer 7, and the n⁺ layer 6*a*. When −3 V is applied to the source line at erasure, a large number of electrons are injected from the source line SL and recombine with accumulated holes or are drifted to the first impurity layer or the bit line BL by electric field, and thus significant erasure time reduction can be expected. Accordingly, a stable state of logic information data "0" can be achieved in a short time, and the operation speed of the dynamic flash memory element improves.

A thyristor structure may be formed by the p layer 1, the n layer 3, the p layer 4, the p layer 7, and the n⁺ layer 6*b*, and the same effect can be obtained by applying, for example, −3 V to the bit line at erasure.

Note that conditions on voltage applied to the bit line BL, the source line SL, the word line WL, and the plate line PL described above are examples for performing erase operation and may be other voltage conditions with which erase operation can be performed. For example, the above description is made on the example in which the gate conductor layer 22 is biased to 0 V, but when the gate conductor layer 22 is biased to, for example, 3 V at erasure, an inversion layer in which majority carriers are electrons can be formed at the interface between the p layer 4 and the gate insulating layer 2, and the area of electron-hole recombination can be increased to achieve a shorter erasure time.

According to the present embodiment, the p layer 7, which is one of constituent components of the MOSFET configured to read and write information, is electrically connected to the p layer 1, the n layer 3, and the p layer 4. Moreover, voltage can be applied to the gate conductor layer 22. Accordingly, in write operation and erase operation, the substrate bias does not become unstable in a floating state during MOSFET operation nor a semiconductor part below the gate insulating layer 8 is not completely depleted, unlike an SOI structure, for example. Thus, for example, the threshold value and drive current of the MOSFET are unlikely to be affected by an operation situation. Accordingly, as for characteristics of the MOSFET, it is possible to widely set voltage for desired memory operation by adjusting the thickness of the second semiconductor layer 7, the kind, concentration, profile of impurities, the impurity concentration and profile of the p layer 4, the thickness and material of the gate insulating layer 8, and the work function of the gate conductor layer 9. Moreover, since a part below the MOSFET is not completely depleted and the depleted layer expands in the depth direction of the p layer 4, coupling of a gate electrode to the word line of a floating body, which is a disadvantage of a DRAM including no capacitor, hardly has influence. Thus, according to the present embodiment, it is possible to design a wide margin of operation voltage as the dynamic flash memory.

A method of manufacturing the dynamic flash memory according to the present embodiment will be described below with reference to FIGS. 4AA-4AC to 4IA-4IC. In each drawing, (A) illustrates a plan view, (B) illustrates a cross-sectional view along line X-X' in (A), and (C) illustrates a cross-sectional view along line Y-Y' in (A).

As illustrated in FIGS. 4AA to 4AC, the p layer 1, the n layer 3, the p layer 4, an insulating layer 41, and a mask material layer 42 are formed from below on the substrate 20. Note that the substrate may be a semiconductor or an insulating film. The p layer 1 and the n layer 3 may be well layers. For example, a silicon oxide film may be used as the insulating layer 41, and for example, a silicon nitride film may be used as the mask material layer 42.

Subsequently, as illustrated in FIGS. 4BA to 4BC, the insulating layer 41, the p layer 4, and the n layer 3 are etched in a region to be a memory cell by a reactive ion etching (RIE) method using mask material layers 42*a* to 42*d* as masks. Note that the bottom of an etched groove aligns with the bottom part of the n layer 3 in the illustration of FIGS. 4BA to 4BC, but the bottom of the groove may be positioned deeper than an upper part of the n layer 3.

Subsequently, as illustrated in FIGS. 4CA to 4CC, the insulating layer 2 is selectively formed on the sidewall of the groove formed as described above and a bottom part thereof by oxidation. The gate insulating layer 2-1 and the gate insulating layer 2-2 are separately illustrated in FIGS. 1 to 3A-3C but are integrally illustrated as the gate insulating layer 2 below. Although not illustrated, for example, an oxide film may be entirely formed by using an atomic layer deposition (ALD) technology. In this case, the gate insulating layer 2 is formed around the mask material layer 42 as well.

Subsequently, as illustrated in FIGS. 4DA to 4DC, gate conductor layer 22 is deposited on the entire surface by, for example, a CVD method and then etched back by a selective RIE method so that the upper surface of the gate conductor layer 22 is positioned lower than the upper surface of the p layer 4.

Subsequently, as illustrated in FIGS. 4EA to 4EC, insulating layer 5 is formed on the entire surface by, for example, the CVD method.

Subsequently, as illustrated in FIGS. 4FA to 4FC, the insulating layer 5 is polished by a chemical mechanical polishing (CMP) technology until the surfaces of the mask materials 42a to 42d are exposed, and then the mask materials 42a to 42d are selectively removed. In addition, the insulating layer 5 is etched back until the surface of the p layer 4 is exposed, and simultaneously, the insulating layer 41 is etched.

Subsequently, as illustrated in FIGS. 4GA to 4GC, the semiconductor layer 7 is grown by, for example, the CVD method under a condition that the semiconductor layer 7 is continuous with the p layer 4 as a crystal layer, and thereafter, is removed except for a part necessary for operating as the MOSFET in a memory cell.

Subsequently, as illustrated in FIGS. 4HA to 4HC, the gate insulating layer 8 and the gate conductor layer 9 are formed and fabricated as gate electrodes of the MOSFET in each memory cell. In FIGS. 4HA to 4HC, these layers are illustrated as gate insulating layers 8a, 8b, and 8c and gate conductor layers 9a and 9c. Thereafter, the n$^+$ layer 6a and the n$^+$ layer 6b are formed by self-alignment.

Subsequently, as illustrated in FIGS. 4IA to 4IC, an insulating layer 31 is formed on the entire surface, and then contact holes 33a to 33d are opened for respective memory cells. Thereafter, wire conductor layers 35 and 36 are formed. The wire conductor layer 35 is connected to the source line SL. Subsequently, an insulating layer 38 is formed, and then second contact holes 37c and 37d are opened, and a wire conductor layer 39 is formed. The wire conductor layer 39 is connected to the bit line BL.

Note that, although only the second wire conductor layer 39 and the insulating layer 38 are provided at the upper part in reality, p layers 4a to 4d at a main lower layer part, the gate conductor layers 9a and 9b, and contact holes 32a, 32b, 33c, 33d, 37c, and 37d are illustrated in the plan view of FIG. 4IA to facilitate understanding.

The vertical section shape of a groove is a rectangular shape in FIGS. 4AA-4AC to 4IA-4IC for description but may be a trapezoid shape.

In the present embodiment, each of the impurity layer 3 and the impurity layer 4 has a column shape with a rectangular bottom surface but may have a column shape with any other polygonal or circular bottom surface.

The n layer 3 only needs to exist at a part to be a memory cell. Thus, although the n layer 3 is formed on the entire surface of the p layer 1 in the illustration of FIGS. 4AA to 4AC, the n layer 3 may be formed only in a selected region on the p layer 1.

The materials of the mask material layer 42 and the gate insulating layer 2 may be any material with which a selection ratio can be employed at etching.

The gate conductor layer 22 may be any semiconductor or conductor to which voltage can be applied.

CMP end point materials are the mask material layers 42a to 42d in FIGS. 4FA to 4FC but may be, for example, the gate insulating layer 2, the insulating layer 5, and the p layer 4.

Any insulating film, such as an SiO2 film, an SiON film, an HfSiON film, or an SiO2/SiN multilayer film, which is used in a normal MOS process may be used as the gate insulating layer 2 and the gate insulating layer 8.

The method of separately forming the wire conductor layer 36 and the wire conductor layer 39 for connection to the line BL is employed in the present description, but the wire conductor layers 36 and 39 and the contact holes 33c and 37c may be formed through a single process by using a damascene method or the like.

In the present invention, the gate conductor layer 9, the semiconductor layer 7, and all wire conductor layers extend in parallel to an X-X' axis or a Y-Y' axis or in the vertical direction in the illustration of FIGS. 4AA-4AC to 41A-4IC, but may each extend in an oblique direction.

In the present invention, the method of producing the n layer 3 and the p layer 4 and then producing the gate insulating layer 2 and the gate conductor layer 22 is illustrated in FIGS. 4BA-4BC to 4DA to 4DC, but a method of forming the gate insulating layer 2 and the gate conductor layer 22 and then vertical opening holes until the p layer 1 is exposed and forming silicon layers as the n layer 3 and the p layer 4 by a selective epitaxial technology is also possible.

The present embodiment has the following characteristics.

(Characteristic 1)

In the dynamic flash memory according to the first embodiment of the present invention, a substrate region in which a MOSFET channel is formed is constituted by the p layer 4 and the p layer 7 surrounded by the insulating layer 2-1, the gate insulating layer 2-2, and the n layer 3. With this structure, majority carriers generated at writing of logic data "1" can be accumulated in the p layer 7 and the p layer 4 and the number thereof can be increased, and thus an information holding time increases. At data erasure, it is easy to perform erasure by providing negative voltage to the n layer 6a connected to the source line SL because of the thyristor structure of the n$^+$ layer 6a, the p layer 7, the p layer 4, the n layer 3, and the p layer 1. Moreover, memory operation can be further stabilized by voltage application to the gate conductor layer 22. Thus, the margin of memory operation can be expanded and electric power consumption can be reduced, which leads to high-speed memory operation.

(Characteristic 2)

The p layer 7, which is one of constituent components of the MOSFET in the dynamic flash memory according to the first embodiment of the present invention, is connected to the p layer 4, the n layer 3, and the p layer 1, and the p layer 7 and the p layer 4 below the gate insulating layer 8 are not completely depleted by adjusting voltage applied to the gate conductor layer 22. Accordingly, for example, the threshold value and drive current of the MOSFET are unlikely to be affected by the situation of memory operation. In addition, since a part below the MOSFET is not completely depleted, coupling of a gate electrode to the word line of a floating body, which is a disadvantage of a DRAM including no capacitor, does not have large influence. Thus, according to the present invention, it is possible to design a wide margin of operation voltage as the dynamic flash memory.

(Characteristic 3)

Since the p layer 7 is surrounded by the gate electrodes of the MOSFET of a cell and an effective channel width is large, the number of surplus holes at writing can be increased and cell current can be increased to enable high-speed memory operation.

(Characteristic 4)

The n$^+$ layer 6a, the wire conductor layer 35 connected to the source line SL, and the contact hole 32a in the dynamic flash memory cell illustrated in FIGS. 4IA to 4IC are shared by adjacent cells. In addition, an n$^+$ layer 6c, the wire conductor layers 36 and 39 connected to the bit line BL, and the contact holes 33c and 37c are shared by adjacent cells. Accordingly, the cell area of the dynamic flash memory according to the present invention is determined by lines and spaces of p layers 7a and 7b and the gate conductor layers 9a and 9c or lines and spaces of the wire conductor layers 35 and 36. Thus, the cell area is $4F^2$ where F represents the minimum dimension in manufacturing, and accordingly, a minute memory cell can be provided.

Second Embodiment

Figure 5:
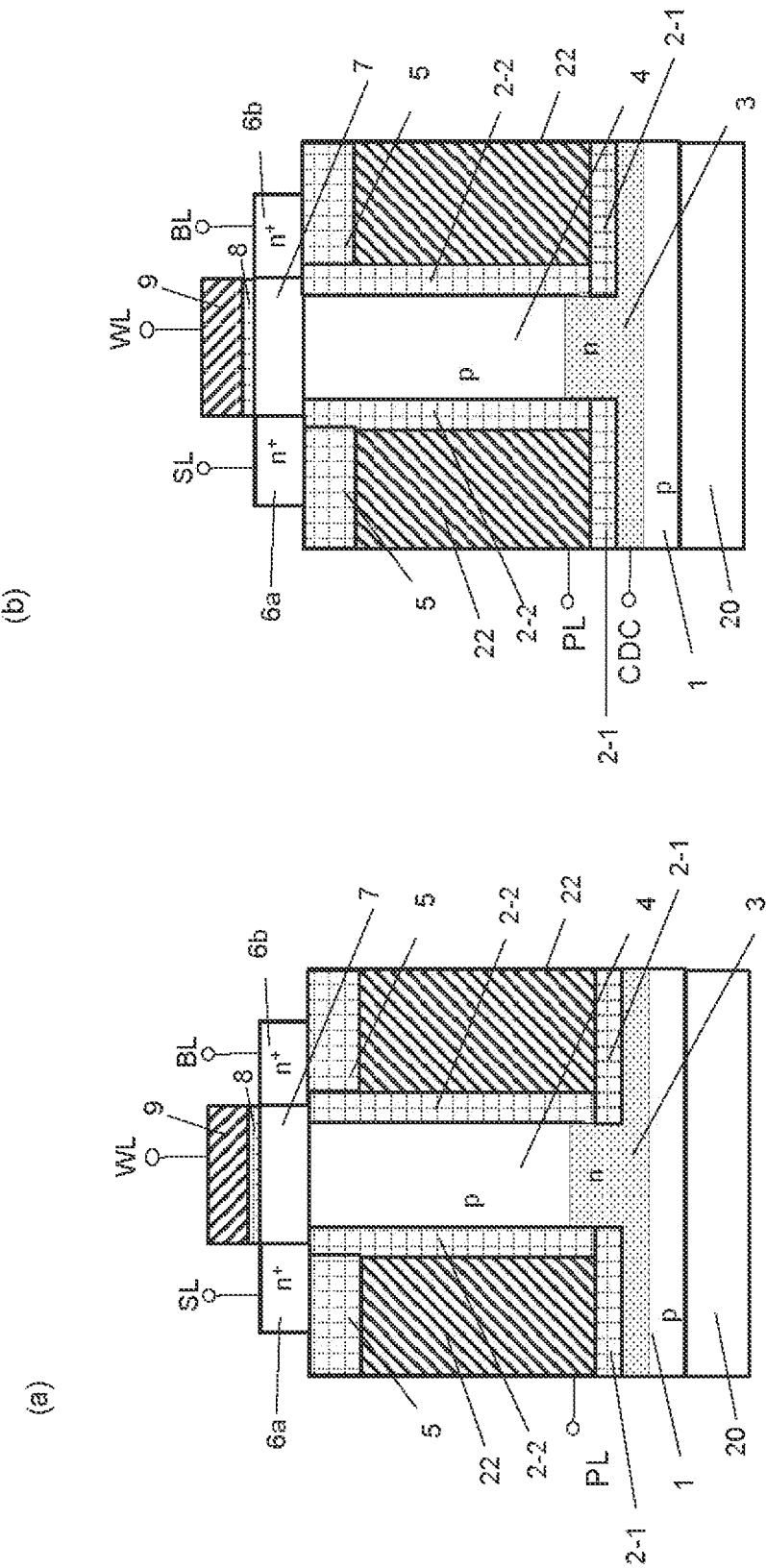
FIGS. 5A and 5B illustrate a sectional structure of a memory device using a semiconductor element according to a second embodiment.

A dynamic flash memory according to a second embodiment of the present invention will be described below with reference to FIGS. 5A and 5B. In FIGS. 5A and 5B, any part identical or similar to that in FIG. 1 is denoted by the same reference number.

As illustrated in FIG. 5A, the bottom of the n layer 3 in FIG. 1 is positioned deeper than the gate insulating layer 2, and the n layer 3 is shared by a plurality of cells. The other configuration is the same as that in FIG. 1. In this case, the gate insulating layer 2 does not necessarily need to contact the p layer 1. With such a configuration as well, similarly to the first embodiment, dynamic flash memory operation is possible by applying voltages to the source line SL, the plate line PL, the word line WL, and the bit line BL.

When the n layer 3 is shared by a plurality of cells as illustrated in FIG. 5B, operation of a plurality of memories can be simultaneously controlled by applying voltage through connection to a control line CDC (example of a "control line" in the claims) as a fifth wiring conductive layer.

At writing of logic storage data "1", in addition to the voltage application conditions in the first embodiment, for example, 1 V can be added to CDC to prevent forward bias of a pn junction with the p layer 4, thereby suppressing electron-hole recombination and promoting hole accumulation.

When storage data is to be erased to "0", the pn junction of the p layer 4 and the n layer 3 is forward biased even by, for example, providing −3 V to CDC and the p layer 1 and setting any other potential to 0 V, and thus holes accumulated in the memory cell can be immediately discharged. In this manner, according to the second embodiment, it is possible to further expand the margin of operation of logic storage data writing to "1" and erasure to "0" in the first embodiment.

The present embodiment has the following characteristics.

(Characteristic 1)

Similarly to the first embodiment, dynamic flash memory operation is possible by applying voltage to the source line SL, the plate line PL, the word line WL, and the bit line BL, and in addition, the operation margin of "1" writing and "0" erasure of storage information data can be expanded to enable high-speed memory operation by applying voltage to the control line CDC.

(Characteristic 2)

Since a plurality of cells are included in the n layer 3, "0" erasure can be performed for the plurality of cells at once.

The present invention can have various embodiments and modifications without departing from the spirit and scope of the present invention. Each above-described embodiment is only intended to describe an example of the present invention and does not limit the scope of the present invention. Any above-described example and modification may be optionally combined. Some constituent components of the above-described embodiment may be omitted as necessary within the technological idea of the present invention.

INDUSTRIAL APPLICABILITY

With a memory function using a semiconductor element according to the present invention, it is possible to provide a high-speed dynamic flash memory with a longer storage time and a smaller amount of electric power consumption than in conventional cases.

The invention claimed is:

1. A memory device using a semiconductor element, the memory device comprising:
a substrate;
a first semiconductor layer disposed on the substrate;
a first impurity layer disposed on a surface of part of the first semiconductor layer, at least part of the first impurity layer being column-shaped;
a second impurity layer contacting the column-shaped part of the first impurity layer and extending in a vertical direction;
a first insulating layer covering part of the first semiconductor layer and part of the first impurity layer;
a first gate insulating layer contacting the first insulating layer and surrounding the first impurity layer and the second impurity layer;
a first gate conductor layer contacting the first insulating layer and the first gate insulating layer;
a second insulating layer formed in contact with the first gate conductor layer and the first gate insulating layer;
a second semiconductor layer contacting the second impurity layer;
a second gate insulating layer surrounding part or entire of an upper part of the second semiconductor layer;
a second gate conductor layer covering part or entire of an upper part of the second gate insulating layer;
a third impurity layer and a fourth impurity layer contacting a side surface of the second semiconductor layer outside one end of the second gate conductor layer in a horizontal direction in which the second semiconductor layer extends;
a first wire conductor layer connected to the third impurity layer;
a second wire conductor layer connected to the fourth impurity layer;
a third wire conductor layer connected to the second gate conductor layer; and
a fourth wire conductor layer connected to the first gate conductor layer, wherein
memory write operation is performed by controlling voltage applied to the first wire conductor layer, the second wire conductor layer, the third wire conductor layer, and the fourth wire conductor layer to perform operation of generating electrons and holes in the second semiconductor layer and the second impurity layer by an impact ionization phenomenon with current flowing between the third impurity layer and the fourth impurity layer or by gate-induced drain leakage current, operation of removing the electrons or holes that are minority carriers in the second semiconductor layer and the second impurity layer among the generated electrons and holes, and operation of leaving, in the second semiconductor layer and the second impurity layer, some or all of the electrons or holes that are majority carriers in the second semiconductor layer and the second impurity layer, and
memory erase operation is performed by controlling voltage applied to the first wire conductor layer, the second wire conductor layer, the third wire conductor layer, and the fourth wire conductor layer to remove the left electrons or holes that are majority carriers in the second semiconductor layer from at least one of the first impurity layer, the third impurity layer, and the fourth impurity layer.

2. The memory device using the semiconductor element according to claim 1, wherein the first wire conductor layer connected to the third impurity layer is a source line, the second wire conductor layer connected to the fourth impurity layer is a bit line, the third wire conductor layer connected to the second gate conductor layer is a word line, the fourth wire conductor layer connected to the first gate conductor layer is a plate line, and memory writing and erasure are performed by providing voltage to the source line, the bit line, the plate line, and the word line.

3. The memory device using the semiconductor element according to claim 1, wherein majority carriers in the first impurity layer are different from majority carriers in the first semiconductor layer.

4. The memory device using the semiconductor element according to claim 1, wherein majority carriers in the second impurity layer are same as majority carriers in the first semiconductor layer.

5. The memory device using the semiconductor element according to claim 1, wherein majority carriers in the third impurity layer and the fourth impurity layer are same as majority carriers in the first impurity layer.

6. The memory device using the semiconductor element according to claim 1, wherein concentration is lower in the first impurity layer than in the third impurity layer and the fourth impurity layer.

7. The memory device using the semiconductor element according to claim 1, wherein an upper part of the first impurity layer is positioned shallower than a bottom part of the first gate conductor layer.

8. The memory device using the semiconductor element according to claim 1, wherein the first semiconductor layer, the first impurity layer, the second impurity layer, the second semiconductor layer, and the third impurity layer form a thyristor structure.

9. The memory device using the semiconductor element according to claim 1, wherein the first semiconductor layer, the first impurity layer, the second impurity layer, the second semiconductor layer, and the fourth impurity layer form a thyristor structure.

10. The memory device using the semiconductor element according to claim 2, wherein a source-line contact hole for connecting the source line and the third impurity layer, and the first wire conductor layer are shared between adjacent cells.

11. The memory device using the semiconductor element according to claim 2, wherein a bit-line contact hole for connecting the bit line and the fourth impurity layer, and the second wire conductor layer are shared between adjacent cells.

12. The memory device using the semiconductor element according to claim 1, wherein a bottom part of the first impurity layer is positioned deeper than a bottom part of the first insulating layer, and the first impurity layer is shared among a plurality of cells.

13. The memory device using the semiconductor element according to claim 12, further comprising a fifth wire conductor layer connected to the first impurity layer, wherein the wire conductor layer is a control line to which desired voltage can be applied.

14. The memory device using the semiconductor element according to claim 1, wherein the first impurity layers of adjacent cells are connected to each other by a semiconductor or a metal layer.

* * * * *